United States Patent [19]
Lee et al.

[11] Patent Number: 5,844,243
[45] Date of Patent: Dec. 1, 1998

[54] METHOD FOR PREPARING DIGITAL RADIOGRAPHY PANELS

[75] Inventors: Denny Lap Yen Lee, Chester; Lawrence Kai-Fun Cheung, Berwyn, both of Pa.

[73] Assignee: Direct Radiography Co., Newark, Del.

[21] Appl. No.: 893,075

[22] Filed: Jul. 15, 1997

[51] Int. Cl.$^6$ ................................................. G01T 1/24
[52] U.S. Cl. .......................... 250/370.09; 250/370.11; 427/251
[58] Field of Search ................. 250/370.08, 370.09, 250/370.11, 580, 208.1; 427/251, 255.5, 282, 287, 256

[56] References Cited

U.S. PATENT DOCUMENTS

| | | |
|---|---|---|
| 2,753,278 | 7/1956 | Bixby et al. . |
| 4,770,965 | 9/1988 | Fender et al. . |
| 4,833,723 | 5/1989 | Loveridge et al. . |
| 5,105,087 | 4/1992 | Jagielinski ............... 250/370.08 |
| 5,319,206 | 6/1994 | Lee et al. . |
| 5,369,281 | 11/1994 | Spinnler et al. ............ 250/370.09 |
| 5,381,014 | 1/1995 | Jeromin et al. . |

OTHER PUBLICATIONS

"Imaging for Microfabrication," by J.M. Shaw,.Chapter 18, pp. 567–586, Imaging Process and Materials, A. Shepp, editor. Van Norstrand Reinhold, New York, 1989.

The Handbook of Deposition Technologies for Films and Coationgs, 2nd Ed., R.F. Bunshah, editor. Noyes Publications, Park Ridge, N.J. 1994.

"Modular Series on Solid State Devices," vol. 5, Introduction to Microelectronic Fabrication, by R.C. Jaeger. Addison–Wesley, New York, 1988.

"Design and Development of a Fiber Optic TDI CCD–based Slot–Scan Digital Mammography System," by Emre Toker and Michelle F. Piccaro. SPIE Proceeding, vol. 2009, p. 246, Dec. 1993.

*Primary Examiner*—Edward J. Glick
*Assistant Examiner*—Darren M. Jiron
*Attorney, Agent, or Firm*—Ratner & Prestia

[57] ABSTRACT

A method for preparing X-ray image capture panels suitable for use in digital, radiography is disclosed. Array modules with sharp, steep edges suitable for tiling to form X-ray image capture panels are prepared placing an array module against an edge piece, and vacuum depositing a radiation detecting material on the top surface of the array module and the edge piece while simultaneously moving at least one of them relative to the other in the horizontal and/or the vertical direction.

30 Claims, 4 Drawing Sheets

METHOD FOR PREPARING DIGITAL RADIOGRAPHY PANELS

FIELD OF THE INVENTION

This invention relates to a method for preparing large size image capture panels suitable for use in digital imaging. In particular, this invention relates to a method for preparing modules suitable for forming large X-ray image capture panels through tiling.

BACKGROUND OF THE INVENTION

Although conventional film-screen X-ray radiography has been successfully used for nearly a century, it still has many deficiencies. The exposure range of the film screen system is limited so that the film can be over- or under-exposed. The exposure display latitude and the contrast of the film are also limited. The film requires wet chemical processing. Not only is chemical processing inconvenient, it also delays access to the image.

Digital radiography provides a solution to the problems of conventional radiography.

A variety of systems have been developed to capture patterns of X-rays using solid state components. Such systems typically use X-ray sensitive phosphors, intensifiers or photoconductive materials to convert X-rays patterns to electrical signals. These systems generally involve the use of a plurality of discreet sensors each sensor representing a picture element (Pixel) arrayed in a plurality of rows and columns for converting an X-ray image pattern into electrical signals, which are subsequently used to produce a visible display of the X-ray image. U.S. Pat. No. 5,319,206 discloses such a radiographic image capture panel and a sensor structure used in capturing X-ray radiation.

Practical panels usable for most medical and industrial radiographic applications required capturing images of a size approximately 14 inches by 17 inches (about 35.6 cm by 43.2 cm). Such image size requires about 7.5 million pixels. Even with current technology, yields of panels with such large number of pixels are very low, therefore, panels of that size become extremely expensive. In practical terms, panels larger than 10 by 10 inches are far too expensive to be commercially useful.

To overcome this size limitation, large solid state X-ray image capture panels are assembled from a plurality of smaller solid state X-ray detectors, or modules.

In manufacturing such panel, the modules are precision ground and juxtaposed, or "tiled," on a substrate prior to the deposition on the panel of the radiation detection layer. Following assembly of the modules, a continuous radiation detecting layer is disposed over the modules to form the detection panel. Formation of such a panel in which radiation detection is accomplished through the generation of electrical charges in a photoconductive layer such as selenium, and capture of the generated charges in individual charge storage capacitors in each pixel, is disclosed for example, in Jeromin et al., U.S. Pat. No. 5,381,014, which is incorporated herein by reference.

When assembling larger panels using smaller modules, the radiation capture layer is deposited after the modules have been assembled, bridging over the seams. This is only partially effective because there exists between the assembled panels a gap. When the detecting layer is deposited over the assembled modules, the gap causes the thickness of the detecting layer in the gap and the vicinity of the gap to vary. This variation extends over the sensors against the edge. Because response to X-rays depends on the thickness of the radiation detection layer over the sensors, a region of irregular response to X-rays is formed near the seam between the modules. The result is an undesirable artifact in the displayed image.

This problem could be avoided if the modules were coated with the radiation detection layer prior to tiling. In such case, the detection layer must be uniformly thick up to the edge of the module, and must form a substantially planar side perpendicular to the module surface and substantially coplanar with the module polished side. The side of the detection layer must be uniform the entire length of the module so that a regular, rather than an irregular seam is produced between the modules.

It has been found, however, that if the radiation layer is deposited on the modules prior to assembly of the larger panel, the deposited radiation detection layer does not form a sharp, substantially planar side perpendicular to the module surface and substantially co-planar with the module polished side, but tends to be rounded, gradually reducing in thickness as it reaches the module edges. The end result is again a non uniform layer thickness particularly in the pixels adjacent the gap.

Efforts attempting to first coat the radiation detection layer on the modules, and then grind and polish the module sides have not shown promise, because the materials typically used to form the detecting layer are brittle, and tend to break and chip during the grinding and polishing process.

The use of masks during deposition has also not shown great promise because as the mask is removed, the detecting layer again tends to chip and break with the removed mask.

Thus, a need exists for a method for forming modules that comprise a uniform detection layer that extends to the module end and which forms a substantially planar edge perpendicular to the module surface and substantially coplanar with the module polished edge.

SUMMARY OF THE INVENTION

The invention is a process for coating a support, having a top surface and at least one precision finished side extending in a plane substantially perpendicular to the top surface, with a radiation detection layer having a steep edge suitable for use in assembling a large scale image capture panel, said method comprising the steps of, in order:

A) placing said support against a reference edge piece having a reference top surface and a reference side in a plane substantially perpendicular to the reference top surface, such that the support precision finished side and the reference side are parallel, and B) vacuum depositing a radiation detecting material on the top surfaces of said support and said reference piece while simultaneously moving at least one of said support and said reference piece relative to the other in a direction such that the support precision finished side and the reference side remain parallel and at a constant distance from each other, to form said radiation detection layer having a steep edge suitable for use in assembling a large scale image capture panel.

In one embodiment the invention is used to form radiation detection modules that comprise a uniform radiation detection layer with a steep, uniform side, useful in assembling larger panels comprising a plurality of such modules.

In another embodiment this invention is used to form a large scale radiation detection panel by tiling two or more modules each comprising a uniform radiation detection layer with a steep, uniform side.

DETAILED DESCRIPTION OF THE INVENTION

The invention will next be described with reference to the drawings in which similar elements in the different figures are identified with same numbers.

Figure 1:
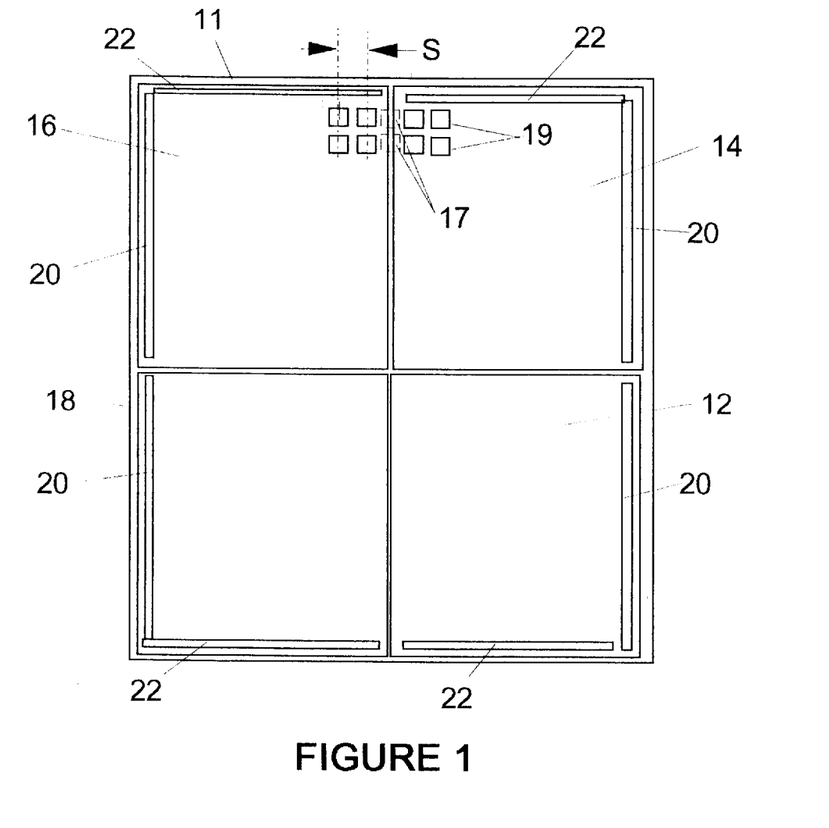
FIG. 1 illustrates a large radiation detection panel assembled using four modules prepared according to the present invention.

Referring briefly to FIG. 1, there is shown in schematic representation a large radiation detection panel 10 assembled by combining four smaller radiation detection modules 12,14,16 and 18. Each of the modules 12 through 18 comprises a plurality of radiation sensors 19 arrayed in rows and columns separated by interstitial spaces in which run access conductive strips (not shown) for accessing the sensors. Access to the panel is through connecting strips 20 and 22 which allow to input electronic control signals and retrieve information carrying signals from the sensors in the panel.

The radiation sensors typically include a substantial number of electronic components, such as switching elements, charge capture and storage elements, connections to conductors for accessing the elements in the sensors and whatever else is required in each pixel for capturing and retrieving the electrical signal which represents the image information at each pixel.

When the radiation detection layer is a photoconductive material, the modules 12, 14 etc. comprise a dielectric support, usually glass, which supports a plurality of TFT transistors, arrayed on the top surface of the support; a plurality of charge storage capacitors also arrayed on the top surface of the support, each of which has a conductive inner microplate connected to a TFT transistor; and means for electronically activating the TFT transistors and individually accessing each of the capacitors. The module may also comprise a dielectric layer disposed on between the support and transistors and capacitors so that the transistors and capacitors are arrayed on the dielectric layer instead of the support. Each capacitor corresponds to a pixel in the X-ray image. A continuous layer of radiation detecting material is disposed on the surface of the support that contains the capacitors and transistors.

Typical such sensor and modules are described in, among others, the aforementioned U.S. Pat. No. 5,319,206, to Lee et al., the contents of which are incorporated herein by reference.

When the radiation detecting material is a scintillating material, the modules comprise a plurality of transistor-photodiodes instead of the transistor-capacitors described above. The photodiodes are typically a one micron thick layer of amorphous silicon deposited between 25–100 nanometer thick p-doped and n-doped layers of amorphous silicon. The thickness of the various layers can be adjusted to maximize response, depending on the spectral emission of the scintillating material.

When X-rays strike the scintillating material, visible light is produced. The amount of light produced at each pixel in the image is read out and stored in a computer. The data can be reconstructed to form the X-ray image.

The particular sensor structure is not significant in understanding and practicing this invention. This invention is equally applicable to all instances where overlaying the electronic components of the sensors there is a continuous layer of a radiation detection material whose uniformity over the full module active surface is important in achieving uniform response of the sensors to the radiation exposure.

RADIATION DETECTING MATERIAL

The radiation detection layer can be any suitable X-ray detecting material that can be deposited by vacuum deposition techniques. This includes scintillating materials (i.e., phosphors) and X-ray photoconductive materials.

Scintillating materials absorb X-rays and emit radiation of a longer wavelength, typically ultraviolet or visible radiation. A scintillating material that is a candidate for vacuum deposition is cesium iodide.

X-ray photoconductive materials have a high resistivity in the absence of X-rays but become relatively less resistive in the presence of X-rays. Many semiconductors that are X-ray photoconductive are candidates for vacuum deposition. These include, for example: IIB–VIB semiconductors, such as CdS, CdSe, and CdTe; IIIB–VB semiconductors; chalcogenides, such as $As_2S_3$ and $As_2Se_3$; as well as other semiconductors, such as $HgI_2$, $PbI_2$, PbO, TlBr, and $BiI_3$.

The specific type of material used will depend on the desired X-ray absorption efficiency, charge generation efficiency, and charge transport properties. Selenium and various selenium alloys, such as a selenium-arsenic alloy having about 0.1 to 0.5% by weight arsenic, are a preferred X-ray photoconductors.

The radiation detecting material is typically sufficiently thick to absorb at least a substantial portion of the incident X-radiation to provide high efficiency in radiation detection. Cesium iodide layers, for instance, used with fiber optic tapers are typically 100 micrometers to 200 micrometers thick.

Depending on the application, photoconductive layers of selenium are typically about 100 micrometers to about 600 micrometers thick. For mammography, the selenium layer is typically 100 micrometers to 150 micrometers thick. For chest X-rays, the selenium layer is typically about 450 micrometers to about 500 micrometers thick.

PREPARATION OF X-RAY IMAGE CAPTURE PANELS

Hereinafter in this description the term TFT module will be used for describing a module prior to the deposition of the radiation detection layer, even though it may be that the module contains no TFT transistors.

In practice, the TFT modules are fabricated using technology for microfabrication of the transistors and capacitors which is well known in the art. See, for example, Modular Series On Solid State Devices, Vol. 5 of Introduction to Microelectronic Fabrication, R. C. Jaeger, Addison-Wesley, New York, 1988, and Imaging for Microfabrication, J. M. Shaw, Chapter 18 in Imaging Processes and Materials, J. M. Struge, V. Walworth, and A. Shepp, eds, Van Norstrand Reinhold, New York, 1989, pp. 567–586.

TFT modules useful in assembling large panels are preferably rectangular and must have at least one, and preferably two highly uniform polished, precision finished sides. In a typical application where four modules are assembled to produce a 14" by 17" radiation detection panel useful in medical radiography, and wherein the sensors are of the type disclosed in, the aforementioned Lee et al U.S. Pat. No. 5,319,206, arrayed in parallel rows and columns, the following are typical dimensions and tolerances that are required to obtain a resolution of, for instance 180 pixels per inch.

For 180 pixels/inch, the distance "S" between adjacent pixel centerlines is about 140 microns. If only one pixel loss is acceptable at the junction between modules, then the space available for cutting grinding and polishing a module edge is half the 140 microns or 70 microns. Assuming a polishing smoothness of the order of 15 microns, the side of the module must be kept within and no more than 50 microns from the last row of pixels along the edge. This means that the deposited radiation detection layer thickness must remain constant to within a maximum of 50 microns from the edge of the module, and preferably less, to assure that the last row of sensors is covered by a uniform thickness radiation detecting layer. Radiation detection layers having an edge satisfying these conditions will be referred hereinafter as steep edge layers, and modules sides where the radiation detection layer is a steep edge will be referred to as a precision finished steep end side.

The TFT module itself must also have a highly uniform, precision finished side. Any technique that produces a uniform, precision finished side, such as scribe and break, precision grinding, dicing, or precision laser cutting, can be used. An apparatus for producing precision finished module sides by precision grinding, is disclosed in U.S. patent application Ser. No. 08/680,952, filed Jul. 16, 1996, allowed Mar. 14, 1997, and incorporated herein by reference.

The radiation detection layer is applied to the TFT module using conventional vacuum deposition techniques. These techniques include, for example, physical vacuum deposition, chemical vacuum deposition, plasma-enhanced chemical vacuum deposition, flash evaporation, sputtering, electron beam evaporation, and ion assisted deposition.

Apparatus and techniques for vacuum deposition are well known to those skilled in the art. Vacuum deposition techniques are described, for example, in the Handbook of Deposition Technologies for Films and Coatings, 2nd. Ed., R. F. Bunshah, Ed., Noyes Publications, Park Ridge, N.J., 1994. Physical vacuum deposition of selenium is described, for example, in Bixby, U.S. Pat. No. 2,753,278.

Figure 2:
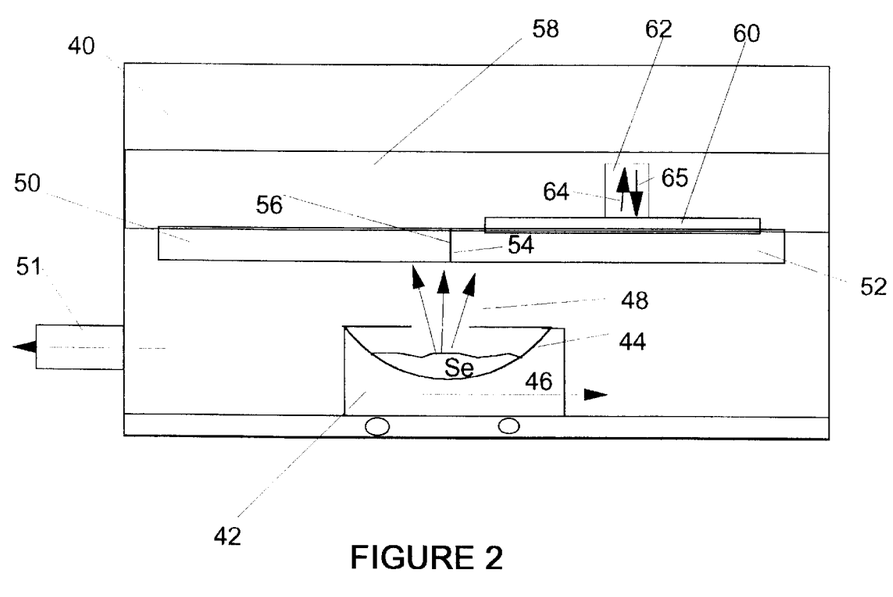
FIG. 2 illustrates apparatus for depositing a radiation detection layer on a module wherein the relative motion of a reference surface and a module end surface is in a first, or vertical direction.

Referring next to FIG. 2 there is shown in schematic representation apparatus for preparing a module according to the present invention. The apparatus shown is useful in applications where the module has one precision finished side, and is useful in assembling a larger panel containing two modules, each having one such precision finished side placed opposite the other.

Within a vacuum chamber 40 an evaporation source 42 is formed by placing selenium (Se) on a heating plate 44, preferably an evaporating boat. Preferably the source 42 may be moved along the direction of arrow 46 to permit coating a large TFT module. If an alloy or a compound, such as a semiconductor, is to be deposited, two or more evaporation sources can be used to evaporate the components of the alloy or compound. Vacuum means 51 is connected to the vacuum chamber 40 for generating and maintaining the requisite degree of vacuum within the chamber.

On heating, selenium evaporates from the evaporation source and passes directly to the face of the member on which it is to be deposited as shown by arrows 48. The selenium should pass in a direct path from the boat to the member on which it is to be deposited. Good results are obtained when the evaporation is carried out in a vacuum of about 10-5 to 10-6 torr (about $1.3 \times 10\text{-}2$ to $1.3 \times 10\text{-}3$ N/m2) when there is a direct path from the evaporation source to the Member on which the selenium is to be deposited.

As is well known in the art, see, for example, Fender, U.S. Pat. No. 4,770,965, it is often necessary to vary the composition of the selenium alloy deposited, the deposition geometry, the temperature and rate of heating of the evaporation source, the temperature of the member on which the selenium is being deposited, the pressure, and the cleaning and annealing procedures of the member on which the selenium is deposited to yield a detection layer optimized for the intended application During vacuum deposition a TFT module 50 is placed against a reference edge piece 52. The reference edge piece preferably has a precision-finished reference side 54 that is substantially perpendicular to its top surface. The TFT panel also has a precision finished side 56. The precision-finished side 56 of the TFT module is placed against the precision finished reference side 54 of the reference edge piece 52 both on a planar supporting surface 58. The top surface of the array module and the top surface of the edge piece are, preferably, essentially coplanar. The gap between the module and the reference piece should be as small as possible. Depending on the degree of polishing this is preferably 35 microns or less, and more preferably 10 microns or less.

The reference edge piece 52 may be a piece of glass of about the same thickness as the TFT module, typically 0.5 to 1.5 mm. Because the TFT module is formed on a glass support, the glass reference edge piece and the array module will have essentially the same thermal transfer characteristics. Thus, the reference edge piece and the TFT module will remain at about the same temperature during coating. In addition, the same techniques used to prepare a polished side on a glass TFT module can be used to prepare a polished reference side on a glass edge piece.

In one embodiment, the reference edge piece 52 may be another TFT module. If the TFT module and the reference edge piece are not made of the same material, it may be necessary to control the temperature of each piece individually.

The support 58 includes a movable portion 60 supporting the reference piece 52. A moving mechanism 62 is attached to the movable portion 60 and is used to move the reference piece 52 in a direction shown by arrows 64 and 65 perpendicular to the top module surface, in what will be referred too hereinafter the vertical direction. Such movement is in a direction which maintains the gap between the TFT module and the reference edge piece substantially constant, and the module precision finished side parallel to the reference side of the edge piece.

The radiation detecting material is vacuum deposited both on the top surface of the TFT module and the reference edge piece. During deposition the TFT module and the reference edge piece are moved relative to one another. While in the illustration of FIG. 2 the moving piece is the reference piece 52, either the TFT module or the reference edge piece or both the TFT module and the edge piece can be moved during deposition.

Figure 3:
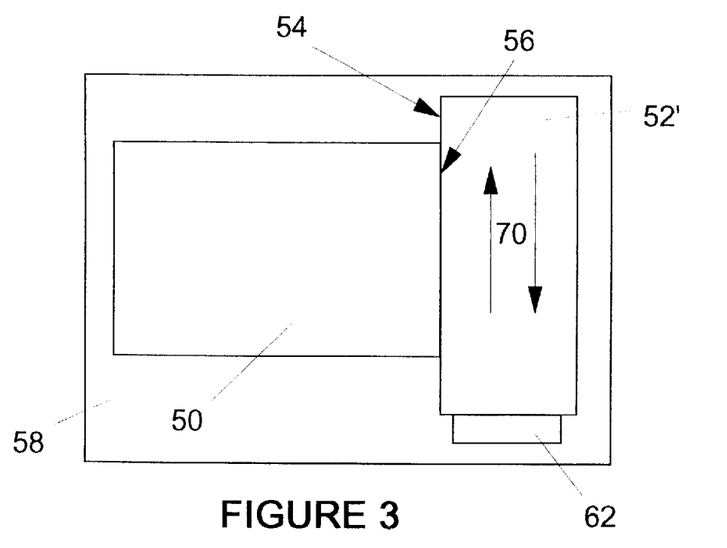
FIG. 3 illustrates the relative positioning and motion within an apparatus for depositing a radiation detection layer on a module, between the module and a reference surface wherein the reference surface is displaced in a second, or horizontal direction.

As shown in FIG. 3, The TFT module 50 and reference edge piece 52 may be moved horizontally rather than vertically, along arrows 70, relative to each other. That is, the TFT module and the edge piece may be moved so that the gap between the TFT module and the edge piece remains substantially constant and the upper surface of the TFT module and the upper surface of the edge piece remain in substantially the same plane.

The TFT module and the edge piece may also be moved either, sequentially or simultaneously, both horizontally and vertically to relative each other. When the TFT module and the reference edge piece are moved simultaneously, both horizontally and vertically relative to each other, only the distance between the TFT module and the edge piece will remain relatively constant.

When a TFT module with more than one precision finished steep edge is desired, as, for example, when two adjacent edges are required to form an array module with a corner suitable for tiling, deposition may be carried out using a multiplicity of reference edge pieces.

To form a corner, for example, two reference edge pieces may be used, placed against each of two adjacent precision finished edges of an TFT module. The reference edge pieces can be moved, in the horizontal direction during coating so that first one edge piece and then the other edge piece extends beyond the corner, but so that both of the edge pieces do not extend beyond the corner at the same time.

Figure 4:
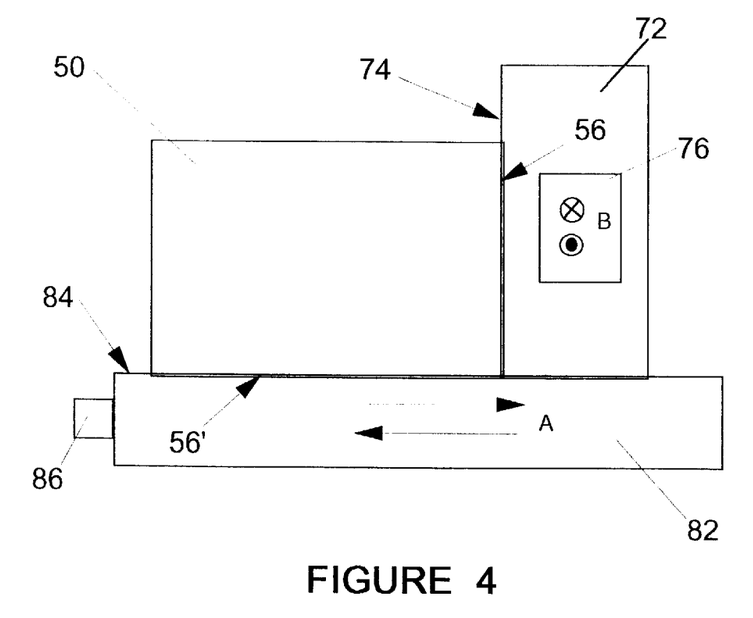
FIG. 4 illustrates the relative positioning and motion within an apparatus for depositing a radiation detection layer on a module, between a module and two reference surfaces wherein a first surface is displaced in the vertical direction and the second is displaced in the horizontal direction.

In an alternative embodiment, illustrated in FIG. 4, one of the reference edge pieces i.e. reference edge piece 82, may extend beyond the corner of the TFT module 50, and the second, reference edge piece 72 may abut against edge piece 82. Reference piece 72 may then be moved in the vertical direction shown by arrows B using a first mechanism 76 and the second reference edge piece 82 may be moved horizontally along arrows A using a mechanism 86. The TFT panel is placed with the two precision finished edges 56 and 56' against the two reference edges 74 and 84 respectively.

During deposition the reference edge 72 is moved vertically while the reference edge piece 82 is moved horizontally, resulting in a module having two precision finished steep edges at 90 degrees to each other, and suitable for assembling a four module panel.

The frequency of motion depends on the deposition rate. At a deposition rate of less than 0.1 micron of radiation detecting material per second, a frequency of a few Hz to a few tens of Hz is adequate. At higher deposition rates, a larger frequency may be required. Typically, an amplitude of 5 microns to 500 microns in the horizontal and/or the vertical direction is used.

The piece or pieces can be moved by a conventional mechanical means, such as by a motor and cam. Alternatively, they can be moved by a piezoelectric device. Piezoelectric devices may be obtained from Polytec PI, Inc., 23 Midstate Drive, Suite 212, Auburn, Mass. 01501.

Coated modules are assembled (Tiled) to form a large image capture panel. The layer of radiation detecting material deposited on each coated module should be of substantially the same thickness. In performing the assembly, a plurality of coated modules is juxtaposed on the top surface of a base plate with the bottom surface of each module on the base plate and affixed thereto. The modules should be juxtaposed so that the top surfaces of the modules are substantially coplanar. The precision-finished side with the sharp, steep edge coating of each module is disposed against the precision-finished side with the sharp, steep edge coating of at least one other module to form a two-dimensional assembly of modules. Preferably four modules are used to assemble a complete panel. Thus each module has two adjacent precision finished sides and two more adjacent sides through which external access to the electronic components on the modules is possible.

When the modules include radiation sensors of the type disclosed in the aforementioned Lee et al. U.S. Pat. No. 5,319,206, it is preferred that the top conductive electrode required for the operation of the sensors be coated over the assembled modules as a continuous conductive layer. To form this top conductive electrode, a layer of indium-tin oxide, aluminum, gold, copper or any other conductive material which is transparent to the radiation used to form the image, is placed on top of the photoconductive layer, usually after tiling.

The thin layer of conductive material is placed on the dielectric layer using well-known vacuum deposition techniques, such as sputtering or electron beam thermal evaporation. In the preferred embodiment, a layer of chromium metal about 150 Å thick can be used.

As also disclosed in the aforementioned Lee et al. U.S. Pat. No. 5,319,206, preferably, a dielectric layer is placed on the photoconductive detection layer before the top layer of conductive material is added. This dielectric layer may be placed thereon by lamination, using a polyethylene terephthalate sheet and a UV-curable adhesive over the assembled panel. Polyethylene terephthalate film having a thickness greater than 10 microns is well suited for use in the lamination process.

The dielectric layer may also be formed on the panel using a wet coating process such as spin, dip or blade coating to form the dielectric layer. The dielectric layer preferably has a thickness greater than 10 microns. Any of numerous dielectric materials well known to those skilled in the art, such as acrylate polymers such as poly(methyl methacrylate) or solvent soluble polyimides, can be applied by such processes.

Figure 5:
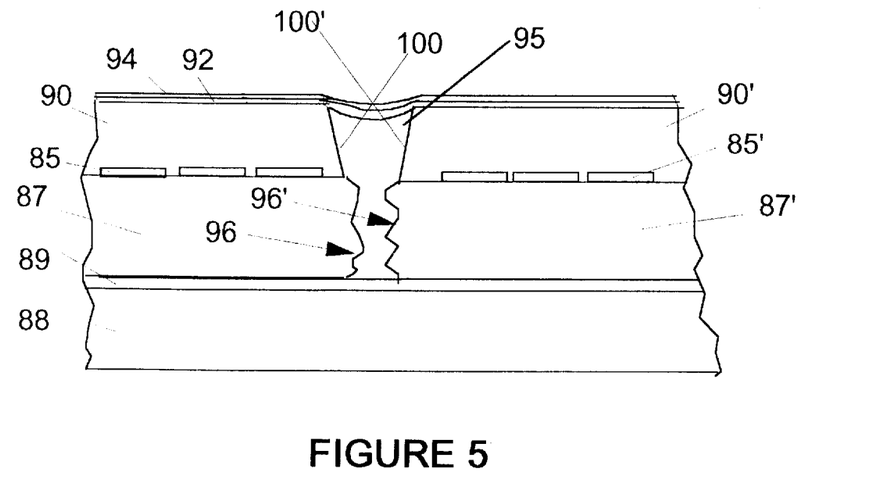
FIG. 5 shows in schematic representation the junction between two adjacent modules in a panel prepared according to this invention.

FIG. 5 shows in schematic elevation cross section two abutting module edges of a first embodiment of a panel comprising an assembly of modules, wherein the photoconductive layer has been deposited on the modules using the present invention and wherein there is deposited across the full panel surface a continuous, preferably transparent, dielectric layer 92 and over this layer a top electrode 94 formed from a continuous conductive transparent layer.

The panels are assembled on a base plate 88 and are attached thereto with an adhesive layer 89. Each panel also comprises a dielectric support 87 and 87' a plurality of sensors 85 and 85' and a photoconductive radiation detection layer 90 and 90', respectively.

The two modules have abutting edges 96 and 96' which are ground and polished to a finish of about 15 microns. An adhesive layer 95 may, optionally, be placed between the abutting end sides. The total distance "d" is preferably kept to around 30 microns or less. The steep edge 100 and 100' of the radiation detection layer end side is kept steep enough so that the radiation detection layer remains uniformly thick over the last sensor prior to the gap between the modules and again over the first sensor following the gap. Preferably, the distance "D" between the beginning of the radiation layer drop in each module, is equal to or less than the distance "S" which is the distance between the center line of two adjacent sensors.

The gap between the two modules is filled with the adhesive 95 substantially to the top of the radiation detection layer. The adhesive is preferably cured, and following curing the optional dielectric and top conductive layers are deposited over the assembled panel each as one continuous layer which bridges the gap between adjacent panels.

Alternatively, a thin layer of conductive material and, optionally, a dielectric layer may be placed on the modules prior to tiling.

Figure 6:
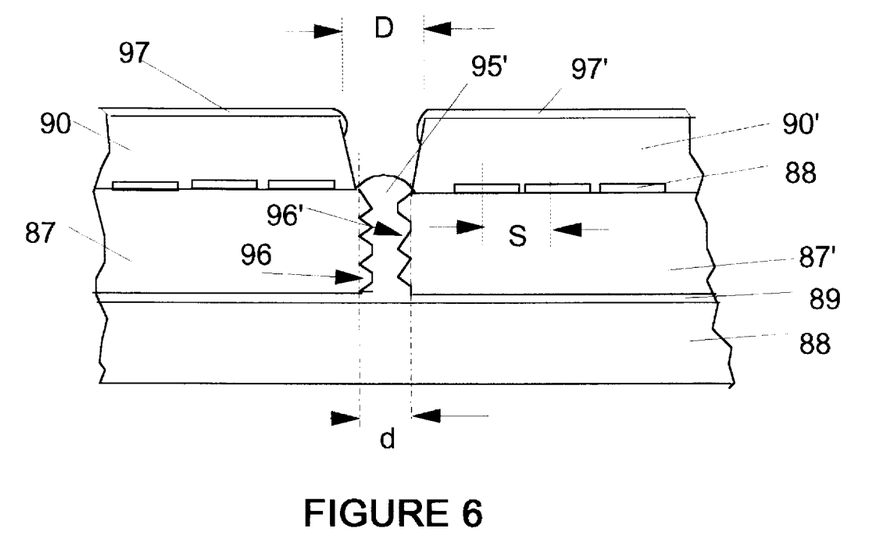
FIG. 6 shows in schematic representation the junction between two adjacent modules in an alternate embodiment of a panel prepared according to this invention.

FIG. 6 shows in schematic elevation cross section, the abutting edges of two modules forming a panel wherein the top electrode does not extend continuously over the assembled panel. In this instance the top conductive layers 97 and 97' (and any optional dielectric layers) are placed on the radiation detecting layer prior to the assembly of the modules into a single panel. The modules are again assembled on base plate 88 and are attached thereto with adhesive layer 89. Each module again comprises a dielectric support 87 and 87' a plurality of sensors 85 and 85' and a radiation detection layer 90 and 90' respectively. Each module includes a transparent top electrode 97 and 97'. An optional adhesive 95' may again be used to fill the gap between the modules. Layer 90 and 90' again has a steep edge as defined for the structure of FIG. 5.

When the top electrode and optional dielectric layers are placed on the modules prior to assembly of the panel, and there is no layer which bridges the gap between adjacent modules, the resulting panel is advantageous because each of the modules is electrically independent. Thus a damaged panel may be repaired if a module is damaged or must be replaced for some other reason, by removing and replacing the modules. Thus, it is not necessary to discard the entire image capture panel.

Figure 7:
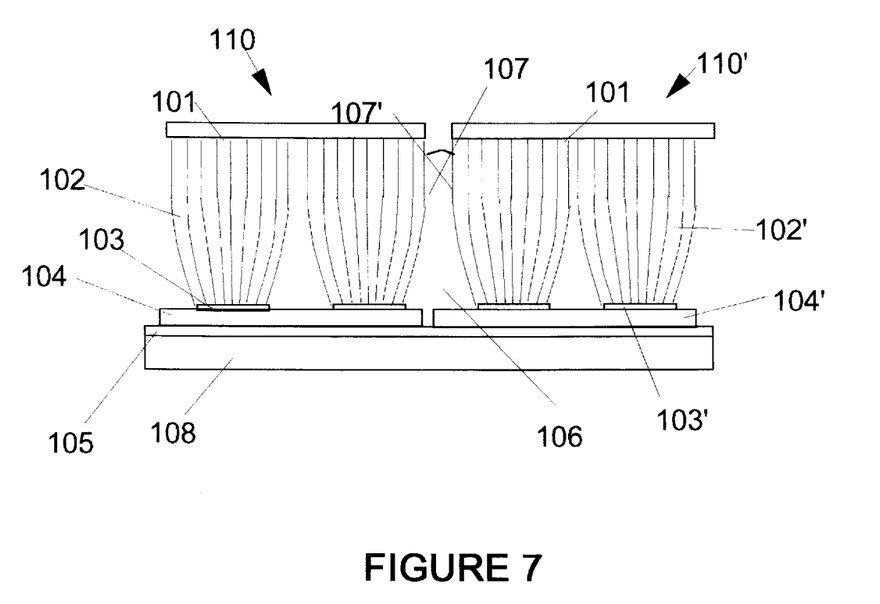
FIG. 7 illustrates yet another embodiment of this invention wherein the radiation detection layer is placed on top of a plurality of optical fibers.

The invention illustrated by FIGS. 5 and 6 show modules of the type disclosed in the aforementioned Lee et al U.S. Pat. No. 5,319,206. FIG. 7 shows an alternate embodiment wherein the image detection panel comprises an assembly of modules in which the radiation detection layer is a scintillation layer. More particularly, two adjoining modules 110 and 110' are shown having precision abutting edges 107 and 107'. The modules comprise a scintillation layer 101 and 101' respectively which may be a cesium iodide layer coated by the process of the present invention. Fiber optic tapers 102 and 102' provide a path for light emitted by the scintillation layer 101 and 101' when exposed to radiation, such as medical diagnostic x-ray radiation, directing such light to a plurality of CCD type sensors 103 and 103' on a support 104 and 104' which usually comprise a silicon wafer containing not only the sensors but also other electronic components for driving the sensors and obtaining data therefrom. The modules are assembled in a similar manner as described above on a base plate 108 using an adhesive 105. Additional adhesive 106 may be used to fill the gap between the modules.

The use of radiation detectors employing scintillator layers coupled through optical fiber tapers to CCD type detectors in medical applications is known in the art and disclosed inter alia in an article by Andrew D. A. Maidment and Martin J. Yaffe entitled "Analysis of the spatial-frequency-dependent DQE of optically coupled digital mammography detectors" published in Med. Phys. 21 (6) June 1994.

INDUSTRIAL APPLICABILITY

The invention is particularly well suited for the preparation of large X-ray image capture panels that are useful in capturing large scale images using smaller modules which can be produced with higher yields at lower costs. Such large scale image capture devices are particularly useful in digital radiography.

In use, a source of X-ray radiation provides a beam of x-rays. A target, i.e., a patient in the case of medical diagnostic imaging, is placed in the X-ray beam path. The X-ray radiation passing through the target is intensity modulated in an imagewise manner because of differential absorption of X-rays by various parts of the target.

In the embodiment of the Lee et al. patent used extensively in illustrating the present invention, when the panel is exposed to X-ray radiation, the X-ray image is captured and stored by the panel in the form of an electrical charge distribution proportional to the incident radiation intensity. In those regions of the panel that are exposed to more X-ray radiation more charges are generated and stored in the charge storage capacitors. Following exposure the image is recovered by reading out the magnitude of the charges stored in the storage capacitors pixel by pixel. Typically the resulting electrical signal output is amplified, and digitized. It is then stored and optionally image processed. The technology for recovering charges from such panels and various digitization and image processing techniques are well known in the art and not a part of the present invention.

As is obvious from the previous description of an assembled panel, there is a column or row missing from the full image at the junction between two adjacent modules, where there are no active detection sensors. The missing column is shown in FIG. 1 as a column of dotted line pixels 17. In the image reconstruction, a new row or column of pixels must be generated to mask the resulting gap in the pixel sequence. This may be done by interpolating new pixel values for the missing pixels using values of surrounding pixels. Such interpolation techniques for correcting or replacing pixel values are well known in the art. See for instance U.S. Pat. No. 4,833,723 issued May 23, 1989 to Loveridge et al. For a more general discussion of digital image processing and filtering techniques see also Digital Image Processing by William K. Pratt, second edition, published by John Wiley and Sons Inc. in 1991.

The digital information thus obtained is preferably stored in a memory and displayed by displaying the information in a display in which the geometric location of each pixel corresponds to the geometric location of the corresponding sensor in the panel. This produces an image that represents the intensity modulation of the radiation incident on the panel. The image may be displayed on a CRT for immediate viewing or printed to produce a hard copy. The data may be stored in a computer or a long term archival memory. It can also be electronically transmitted for viewing at a remote location.

EXAMPLES

Example 1

Selenium deposition was carried out in a conventional cylindrical vacuum deposition chamber. The chamber was about 3 feet (about 0.9M) in diameter and 4 feet (about 1.2M) high equipped with a stainless steel shroud. The sample was mounted about 30 inches (about 0.75M) above an about 5 inch by 8 inch (about 13 cm by 20 cm) boat.

The sample was about 5 cm by 7.5 cm piece of a thin film transistor array module about 1.1 mm thick. The sample had been scribed and broken to produce a smooth edge. The edge piece was a standard 1 inch by 3 inch (about 2.5 cm by 7.5 cm) microscope slide with approximately the same thickness as the array module. The edge piece was mounted against the sample so that the surfaces to be coated were in substantially the same plane. The gap between the edge piece and the sample was estimated to be about 25 microns. The substrate and edge piece were mounted on a water-cooled copper block and maintained at 70°±1° C. during deposition.

The edge piece was mounted so that it could be moved back and forth along the edge of the sample during deposition. The edge piece was moved by a piezoelectric device (Available through Radioshack). The amplitude of the motion was 15 microns. The frequency was 10 Hz.

Deposition was carried out in the conventional manner. The chamber was evacuated to about 10-6 torr (about 1.3×10-3 N/m2) before deposition began. Selenium shot was heated in the boat to about 220° C. Deposition of an about 500 micron thick coating of selenium required about 100 min.

A steep edge was observed for the selenium layer when the coated sample was examined with an optical microscope.

Example 2

The procedure of Example 1 was repeated except that the edge piece was moved in the vertical direction along the edge of the sample. A steep edge was observed for the selenium layer when the coated sample with an optical microscope.

Having described the invention, we now claim the following and their equivalents.

What is claimed is:

1. A process for coating a radiation detection layer having a steep edge suitable for use in assembling a large scale image capture panel on a top surface of a support, said support also comprising at least one precision finished side extending in a plane substantially perpendicular to the top surface, the process comprising the steps of, in order:
   A) placing said support against a reference edge piece having a reference top surface and a reference side in a plane substantially perpendicular to the reference top surface, such that the support precision finished side and the reference side are parallel, and
   B) vacuum depositing a radiation detecting material on the top surfaces of said support and said reference piece while simultaneously moving at least one of said support and said reference piece relative to the other in a direction such that the support precision finished side and the reference side remain substantially parallel and at a constant distance from each other, to form said radiation detection layer.

2. The process of claim 1 wherein the radiation detection layer is a photoconductive layer.

3. The process of claim 2 in which said photoconductive layer comprises selenium.

4. The process according to claim 1 in which said radiation detection layer is a scintillation layer.

5. The process according to claim 4 wherein the scintillation layer comprises cesium iodide.

6. The process according to claim 1, wherein the support precision finished side is placed against the reference side and the support top surface and the reference top surface are essentially co-planar.

7. The process of claim 1 wherein the support has two precision finished sides each of which is substantially perpendicular to the support top surface, the reference edge piece has two reference sides each perpendicular to the reference top surface, and each precision finished side is placed against one of said reference sides and wherein in step B the support is moved relative to both reference sides in a direction such that each support precision finished side remains parallel to a reference side respectively and the distance between the reference sides and the support precision finished sides remains constant.

8. The process according to claim 7 wherein the support precision finished sides are adjacent sides at substantially 90 degrees to each other.

9. The process according to claim 7 wherein the reference sides move relative to the support precision finished sides.

10. The process according to claim 7 wherein the reference sides move in a direction orthogonal to each other.

11. The process of claim 1 wherein the support is a TFT module.

12. A module useful for assembling a large scale image capture panel, said module, comprising:
   a) a support having a top surface
   b) a plurality of image capture sensors on said support surface,
   c) at least one precision finished side in a plane substantially perpendicular to said support surface and
   d) a radiation detection layer comprising a radiation detecting material deposited on said support over said sensors by a process comprising:
      1) placing the at least one precision finished side against a reference edge piece having a reference top surface and a reference side in a plane substantially perpendicular to the reference top surface, such that the module precision finished side and the reference side are substantially parallel, and
      2) vacuum depositing the radiation detecting material on the top surfaces of said module and said reference piece while simultaneously moving at least one of said module and said reference piece relative to the other in a direction such that the module precision finished side and the reference side remain parallel and at a constant distance from each other.

13. The module according to claim 12 additionally comprising a conductive top electrode layer over the radiation detection layer.

14. The module according to claim 13 additionally comprising a dielectric layer between the radiation detection layer and the conductive top electrode layer.

15. The module according to claim 12 wherein the radiation detection layer is a photoconductive layer.

16. The module according to claim 15 wherein the photoconductive layer is selenium deposited by vacuum deposition.

17. The module according to claim 12 wherein the module has two precision finished sides each of which is substantially perpendicular to the support surface, and wherein the radiation detection layer is deposited on the support and over the sensors using two reference sides each perpendicular to the reference piece top surface, and by placing each precision finished side against one of said reference sides and in step 2 the module is moved relative to both reference sides in a direction such that each precision finished side remains parallel to a reference side respectively and the distance between the reference sides and the precision finished sides remains constant.

18. The module according to claim 17 wherein the precision finished sides are adjacent sides at substantially 90 degrees to each other.

19. The module according to claim 17 wherein in step 2 the reference sides move relative to the precision finished sides.

20. The module according to claim 17 wherein in step 2 the reference sides move in a direction orthogonal to each other.

21. The module of claim 12 wherein the radiation detection layer is a photoconductive layer.

22. The module of claim 12 wherein the radiation detection material is a scintillation material.

23. The module of claim 22 wherein the scintillation material is cesium iodide.

24. The module of claim 22 wherein there is a layer comprising a plurality of light transmitting fibers between the scintillating layer and the sensors.

25. A large image capture panel comprising:
 I) a base plate; and
 II) a plurality of modules on said base plate each of said modules comprising:
  a) a support having a top surface
  b) a plurality of image capture sensors on said support surface,
  c) at least one precision finished side in a plane substantially perpendicular to said support surface and
  d) a radiation detection layer deposited on said support over said sensors by a process comprising:
   1) placing the at least one precision finished side against a reference edge piece having a reference top surface and a reference side in a plane substantially perpendicular to the reference top surface, such that the module precision finished side and the reference side are substantially parallel, and
   2) vacuum depositing the radiation detection layer on the top surfaces of said module and said reference piece while simultaneously moving at least one of said module and said reference piece relative to each other in a direction such that the module precision finished side and the reference side remain substantially parallel and at a constant distance from each other; and
  e) a conductive top layer over said radiation detection layer;
 wherein the plurality of modules on the base plate are assembled on said base plate with each module having at least one precision finished side adjacent a precision finished side of another module.

26. The panel according to claim 25 additionally comprising a dielectric layer coated between the conductive top layer and the radiation detection layer in each module.

27. The panel according to claim 25 wherein the conductive top layer is a continuous layer extending over all the assembled modules.

28. The panel according to claim 27 additionally comprising a dielectric layer extending continuously over all modules between the radiation detection layer and the top conductive layer.

29. The panel according to claim 25 wherein the distance between the last sensor in a first module and the first sensor in a second module against the first module is equal to or less than the distance between the center line on two adjacent sensors.

30. The panel according to claim 25 comprising four modules assembled on the base plate to form the panel, and wherein each module has two precision finished sides, and the radiation detection layer is deposited on the module support and over the sensors using two reference sides, each reference side substantially perpendicular to the reference top surface, and by placing each precision finished side against one of said reference sides and in step 2 moving the module and the reference sides relative to each other in a direction such that each precision finished side remains substantially parallel to a reference side respectively, and the distance between the reference sides and the precision finished sides remains constant.

* * * * *